US006669784B2

(12) United States Patent
Futamura et al.

(10) Patent No.: US 6,669,784 B2
(45) Date of Patent: Dec. 30, 2003

(54) GAS PROCESSING APPARATUS FOR OBJECT TO BE PROCESSED

(75) Inventors: Munehisa Futamura, Shikishima-machi (JP); Teruo Iwata, Asahi-machi (JP)

(73) Assignee: Tokyo Electron Limited, Tokyo-To (JP)

( * ) Notice: Subject to any disclaimer, the term of this patent is extended or adjusted under 35 U.S.C. 154(b) by 80 days.

(21) Appl. No.: 10/060,171

(22) Filed: Feb. 1, 2002

(65) Prior Publication Data

US 2002/0096117 A1 Jul. 25, 2002

Related U.S. Application Data

(60) Division of application No. 09/436,624, filed on Nov. 9, 1999, now Pat. No. 6,372,048, which is a continuation-in-part of application No. 09/092,981, filed on Jun. 8, 1998, now abandoned.

(30) Foreign Application Priority Data

Jun. 9, 1997 (JP) .............................. 9-164878

(51) Int. Cl.$^7$ .............................. C23C 16/00
(52) U.S. Cl. ................. 118/729; 118/724; 118/725; 118/728; 118/733; 219/390; 219/392; 219/418; 219/541; 219/544; 392/497
(58) Field of Search ................. 118/724, 725, 118/728, 729, 733; 219/390, 392, 418, 541, 544; 392/497

(56) References Cited

U.S. PATENT DOCUMENTS

| 5,562,947 A | 10/1996 | White et al. ................. 118/725 |
| 5,618,350 A | 4/1997 | Ishikawa et al. ............. 118/725 |
| 5,688,331 A | 11/1997 | Aruga et al. ................. 118/725 |
| 5,753,891 A | 5/1998 | Iwata et al. .................. 219/390 |

FOREIGN PATENT DOCUMENTS

JP  8-218172  8/1996

*Primary Examiner*—Michael Colaianni
(74) *Attorney, Agent, or Firm*—Smith, Gambrell & Russell, LLP (57) ABSTRACT

A resistance heating element 33 for heating a wafer W is embedded within a ceramic heater 22 that forms a susceptor for a semiconductor wafer W to be processed, and power lines 35 from the resistance heating element 33 extend out of the processing chamber 20. A sheathing bellows 38 that houses the power lines 35 in an insulated state is interposed between the ceramic heater 22 and a base plate 24 of the processing chamber 20, and an end piece 39 of the sheathing bellows 38 is connected by screws 40 to the ceramic heater 22 to provide a space 50 therebetween. The screws 40 are such as to permit the thermal expansion of the sheathing bellows 38. This configuration makes it possible to make the temperature distribution in the surface of the semiconductor wafer uniform and thus improve the uniformity of film formation, and also prevent corrosion of components such as the power lines and terminals, and suppress the generation of particles.

10 Claims, 8 Drawing Sheets

GAS PROCESSING APPARATUS FOR OBJECT TO BE PROCESSED

This application is a division of application U.S. patent application Ser. No. 09/436,624, filed Nov. 9, 1999, now U.S. Pat. No. 6,372,048 which is continuation-in-part of U.S. patent application Ser. No. 09/092,981 (abandoned), filed on Jun. 8, 1998, which is incorporated herein in its entirety by reference.

BACKGROUND OF THE INVENTION

1. Field of the Invention

The present invention relates to a gas processing apparatus for an object to be processed which ensures that the temperature distribution within a surface of an object to be processed, such as a semiconductor wafer, is more even and thus improves the uniformity with which a film is formed thereon, and which also makes it possible to prevent corrosion of components such as power lines and terminals, and suppress the generation of particles.

2. Description of Related Art

During the process of fabricating a semiconductor device, film-formation processes such as chemical vapor deposition (CVD) or sputtering are performed to fabricate an integrated circuit on a semiconductor wafer of a material such as silicon (hereinafter referred to simply as "wafer"). To form a thin film uniformly over a wafer in such a film-formation process, it is necessary to heat the entire surface of the wafer to a predetermined temperature, then maintain that temperature.

One method of heating the wafer involves a film-formation apparatus that uses a ceramic heater. In this processing apparatus, a processing gas for forming a film is supplied into a processing chamber that is maintained at a vacuum, and a ceramic member which acts as a susceptor for the wafer and which also has a resistance heating member embedded therein is disposed below this processing chamber.

Figure 13:
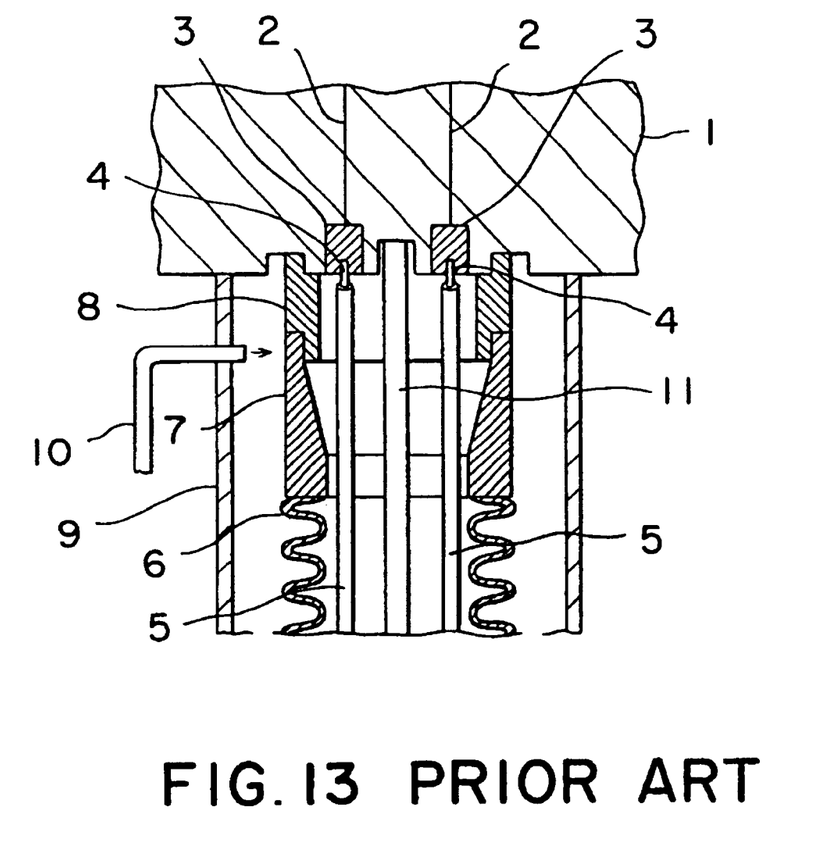
FIG. 13 is a schematic sectional view of a prior-art ceramic heather and wiring configuration.

An enlargement of essential components of a ceramic member within such a processing apparatus is shown in FIG. 13, as disclosed in Japanese Patent Application Laid-Open No. 8-218172. Resistance heating wires 2 are embedded within a ceramic member 1, a pair of terminals 3 are connected to these resistance heating wires 2, and power lines 4 that are covered by insulating tubes 5 are connected to these terminals 3. The power lines 4 pass through a lower wall of the processing chamber and extend out to the exterior of the processing chamber.

The power lines 4 are surrounded by a sheathing bellows 6 made of a material such as stainless steel, an end piece 7 made of a material such as stainless steel is provided at an upper edge of the sheathing bellows 6, a ring member 8 of molybdenum is provided by gold-soldering to an upper edge of the end piece 7, and the ceramic member 1 is also gold-soldered to the ring member 8. A quartz protective tube 9 is provided outward from the sheathing bellows 6, and this protective tube 9 is connected to a gas supply pipe 10 for supplying an inert gas such as nitrogen to the interior of the protective tube 9, to purge it. A thermocouple 11 for measuring the temperature of the ceramic member 1 is housed within the sheathing bellows 6 and is led out to the exterior.

In this manner, the terminals 3 and the power lines 4 are surrounded by the sheathing bellows 6 and other components, and also an inert gas purges the interior of the protective tube 9, to ensure that the terminals 3 and the power lines 4 are not exposed to highly corrosive gases such as halogens. Instead, the terminals 3 and the power lines 4 are placed within an inert gas atmosphere, making it possible to prevent corrosion of the terminals 3 and the power lines 4.

When the interior of the processing chamber is cleaned with cleaning gases such as $ClF_3$ and $NF_3$, the interior of the quartz protective tube 9 is purged with an inert gas, so that the sheathing bellows 6 can be protected within the inert gas atmosphere without coming into contact with the cleaning gases, and thus corrosion of the sheathing bellows 6 can be prevented.

The insertion and gold-soldering of the molybdenum ring member 8 between the end piece 7 of the sheathing bellows 6 and the ceramic member 1 ensures that a material having a coefficient of thermal expansion that is close to that of the ceramic member 1 is in contact with the ceramic member 1, so that no cracks or other damage will occur in the connecting portions between the ring member 8 and the ceramic member 1 at the high temperatures used for film-formation processes (600° C. to 700° C.), for example.

In the above described technique, the molybdenum ring member 8 is inserted and gold-soldered between the end piece 7 of the sheathing bellows 6 and the ceramic member 1, which means that heat from the ceramic member 1 is transferred to the sheathing bellows 6 through this gold-soldered portion. Thus the surface temperature distribution of the ceramic member 1 becomes uneven and, as a result, the uniformity of the film formed during the film-formation process is adversely affected.

In addition, the configuration is such that the quartz protective tube 9 is provided and an inert gas such as nitrogen purges the interior of this protective tube 9, to protect components such as the molybdenum ring member 8, as described above. However, the gold-soldered portions of the molybdenum ring member 8 will become damaged by the thermal cycles during the film formation and the cleaning, and also these gold-soldered portions will be corroded by the cleaning gases, such as $ClF_3$ and $NF_3$, used in the cleaning. This means that the cleaning gases such as $ClF_3$ and $NF_3$ will leak into the ring member 8 through the thus damaged or corroded gold-soldered portions and be dispersed therein, causing corrosion and peeling of the molybdenum ring member 8 as well, and also causing corrosion of the terminals 3 and the power lines 4. As a result, there is a danger of particles being generated.

SUMMARY OF THE INVENTION

The present invention was devised in the light of the above described problems with the prior art, and has as an object thereof the provision of a gas processing apparatus which ensures that the temperature distribution within a surface of an object to be processed is more even and thus improves the uniformity with which a film is formed thereon, and which also makes it possible to prevent corrosion of components such as power lines and terminals of a heating means, and suppress the generation of particles.

In order to achieve the above object, a gas processing apparatus in accordance with the present invention comprises: a processing chamber; a susceptor provided within the processing chamber, for mounting an object to be processed; means for supplying a processing gas into the processing chamber to perform a predetermined process on the object; a resistance heating member embedded in the susceptor for heating the object; a power line, one end thereof being led out from a surface of the susceptor connected to the resistance heating member and the other end being extended to the exterior of the processing chamber; a metal sheath interposed between the surface of the susceptor and a wall of the processing chamber, for surrounding the power line so as to house the power line in an insulated state; and engagement means for connecting an end portion of the sheath adjacent to the surface of the susceptor to the surface of the susceptor.

Since this invention uses an engagement means to connect the sheath to the susceptor, it is more difficult for heat to escape to the metal tube from the susceptor that has been heated to a predetermined temperature by the resistance heater, than the prior-art connection provided by gold-soldering, making it possible to improve the uniformity of the temperature distribution over the surface of the susceptor and thus improve the uniformity of the processing of the object.

This sheath may be provided with an annular end piece at an end portion thereof adjacent to the surface of the susceptor, where this end piece is connected to the surface of the susceptor by the engagement means. The end piece may be configured of a cylindrical portion extending near the surface of the susceptor and a seating portion comprising a flange extending outward from the outer periphery of the cylindrical portion, where the engagement means passes through the seating portion. The annular end piece may be fixed to the susceptor by connecting means such as screw shafts alone in such a manner that the end piece is not in contact with the surface of the susceptor with a space formed between the end piece and the surface of the susceptor. Alternatively, the annular end piece may be fixed to the susceptor by connecting means such as screw shafts alone with the end piece in a line contact with, or in point or spot contact with the surface of the susceptor.

The engagement means may be configured of a screw shaft, where the screw shaft is inserted only partially into the surface of the susceptor, and a space is formed between the end piece and the surface of the susceptor. Thus the provision of this space makes it possible to reliably prevent heat from escaping from the susceptor to the sheath.

The seating portion may be provided with a hole through which the engagement means passes, where this hole has dimensions such that the engagement means passes loosely therethrough. The use of such a configuration makes it possible to permit thermal expansion of the sheath, making it more difficult for the connective portion between the sheath and the susceptor to be damaged, than the prior-art gold-soldering.

A corrosion-resistant tube made of a non-metallic material may be interposed between the surface of the susceptor and the wall of the processing chamber, surrounding the sheath with a space therebetween. This configuration makes it possible to protect the sheath from the highly corrosive cleaning gases during the cleaning. In addition, the cleaning gases do not leak into the interior of the sheath, preventing corrosion of the power lines and suppressing the generation of particles.

The configuration may also be such that an inert gas is supplied into the interior of the sheath. This ensures that the interior of the sheath is purged with the inert gas, making it possible to prevent the dispersion of the highly-corrosive cleaning gases back into the sheath. By allowing the inert gas to flow out from the sheath into the space between the sheath and the corrosion-resistant protective tube, the environment around the sheath can be made an inert gas environment, making it possible to prevent corrosion even further. By allowing the inert gas to flow out even further from the space between the sheath and the corrosion-resistant protective tube into the processing chamber, it is possible to completely prevent corrosion.

DESCRIPTION OF PREFERRED EMBODIMENTS

Embodiments of the gas processing apparatus in accordance with the present invention, respectively will be described below with reference to the accompanying drawings. The embodiments relate to a CVD film-formation apparatus. A schematic view of the CVD film-formation apparatus used in the embodiment of the invention is shown in FIG. 1.

Figure 1:
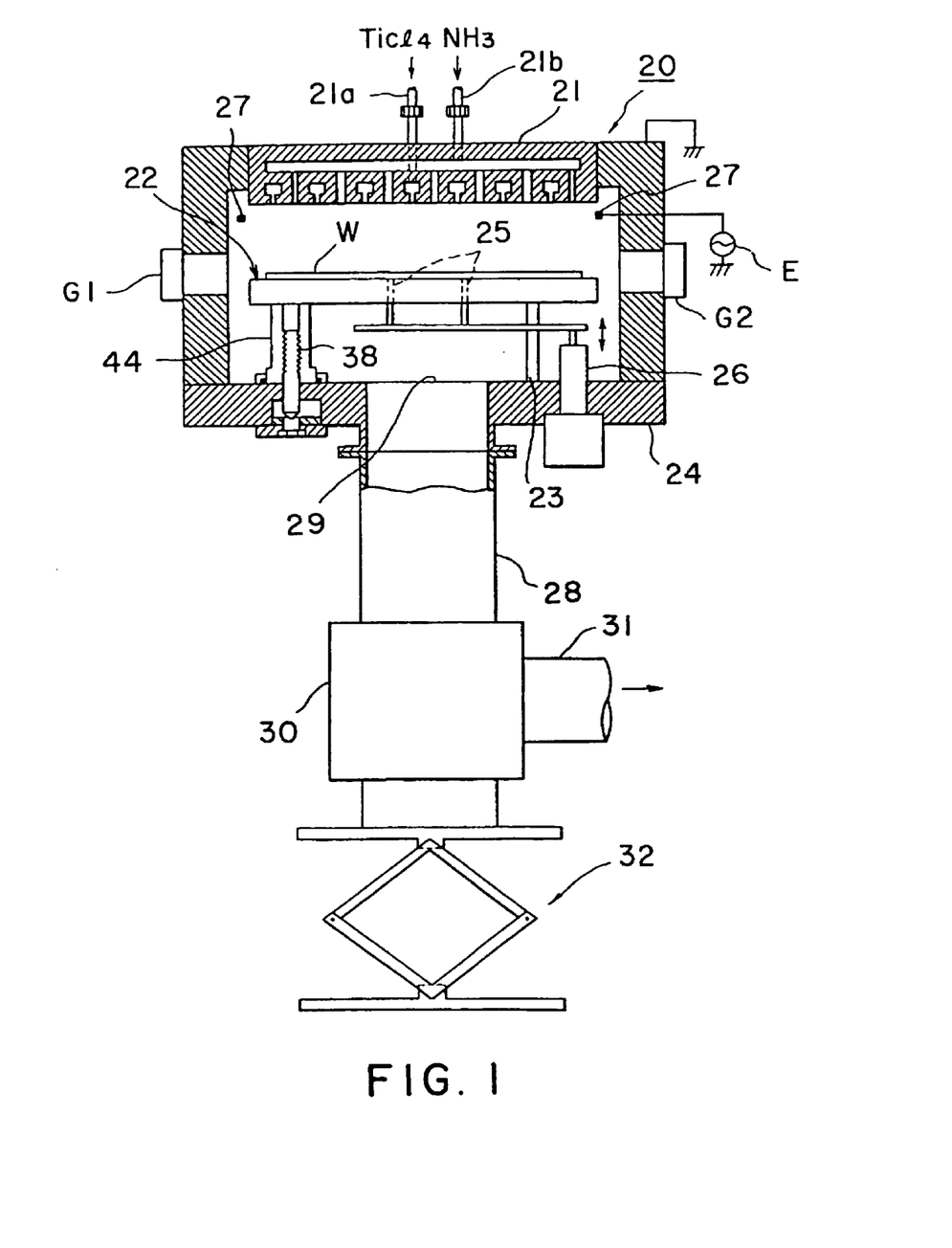
FIG. 1 is a schematic vertical sectional view of a CVD film-formation apparatus to which an embodiment of the present invention is applied.

As shown in FIG. 1, a hermetically sealed processing chamber 20 made of a material such as aluminum has side walls, and gate valves G1 and G2 that each open and close an inlet and an outlet for a wafer W (an object to be processed) are provided on either side in these side walls. Above the processing chamber 20 is provided a gas supply section 21 for supplying processing gases such as $TiCl_4$ and $NH_3$, which are supplied from each of gas supply pipelines 21a and 21b, separately into the processing chamber 20.

A ceramic heater 22 that forms a wafer susceptor is provided within the processing chamber 20 in such a manner as to face the underside of the gas supply section 21. This ceramic heater 22 is formed of an insulating body of a material such as aluminum nitride (AlN), silicon nitride (SiN), or aluminum oxide ($Al_2O_3$). The ceramic heater 22 is supported on a base plate 24 of the processing chamber 20 by support rods 23.

The ceramic heater 22 and pusher pins 25 that can be freely elevated by an elevator mechanism 26 are provided within the base plate 24 of the processing chamber 20. These pusher pins 25 are used when a wafer is transferred to or from a known type of conveyor arm (not shown in the figure) that is inserted from the outside. The pusher pins 25 are disposed so as to support the wafer W at three points, and they pass through the interior of the ceramic heater 22. In addition, plasma generation electrodes 27 that are used during the cleaning of the interior of the processing chamber 20, for example, are disposed around the periphery of the ceramic heater 22 in such a manner that a radio-frequency voltage is applied between these electrodes 27 and the walls of the processing chamber 20.

An exhaust port 29 that is an opening portion at an upper end of an exhaust pipe 28 is formed in the center of the base plate 24 of the processing chamber 20, and the exhaust pipe 28 extends downward and is connected to a downward-extending turbo molecular pump 30. Another exhaust pipe 31 that is connected to a dry pump (not shown in the figure) is provided on a side portion of the turbo molecular pump 30 and a jack mechanism 32 is provided below the turbo molecular pump 30. In other words, the base plate 24 of the processing chamber 20 is hermetically connected in a freely removable manner to a lower edge portion of the side wall by a screw-thread (not shown in the figure), so that the base plate 24 can be raised and lowered by the jack mechanism 32.

Figure 2:
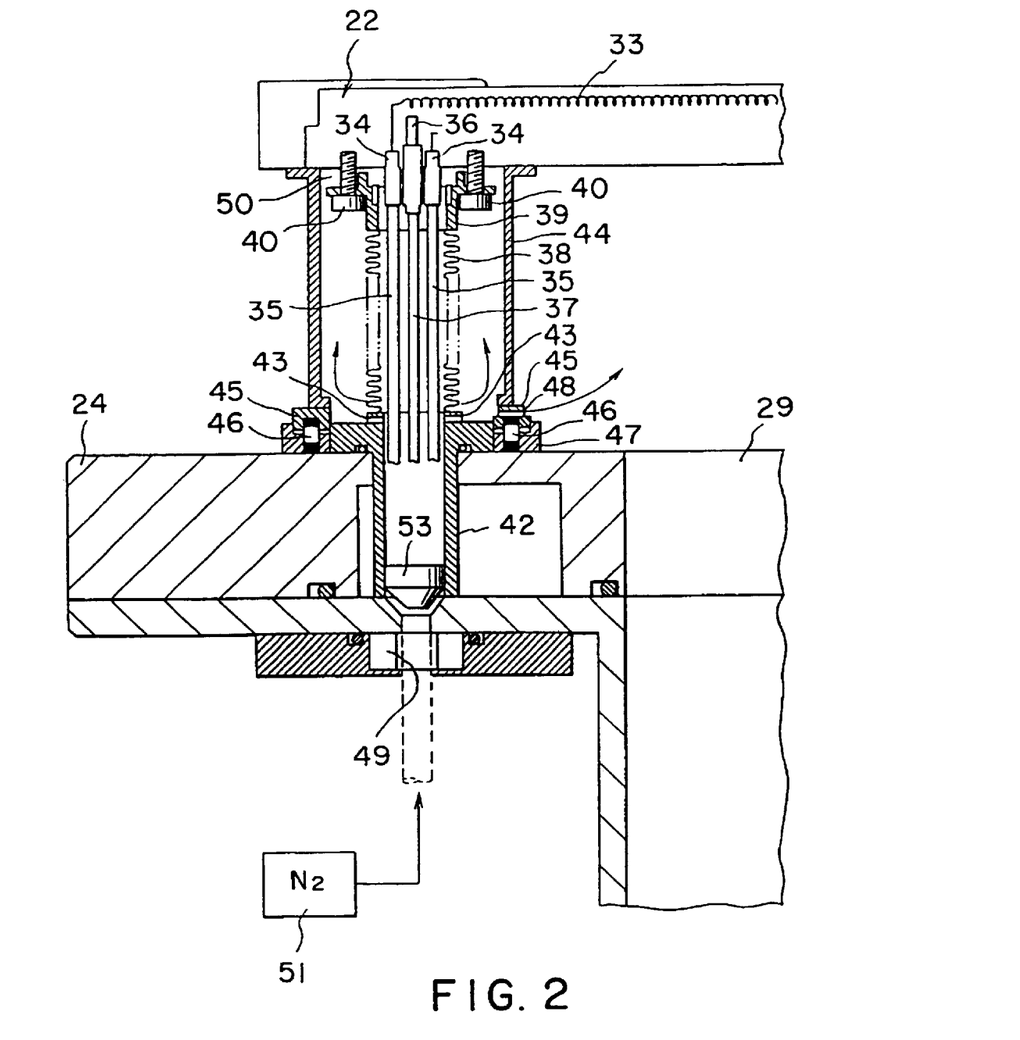
FIG. 2 is an enlarged schematic sectional view of the ceramic heater and wiring configuration of the CVD film-formation apparatus shown in FIG. 1.
Figure 3:
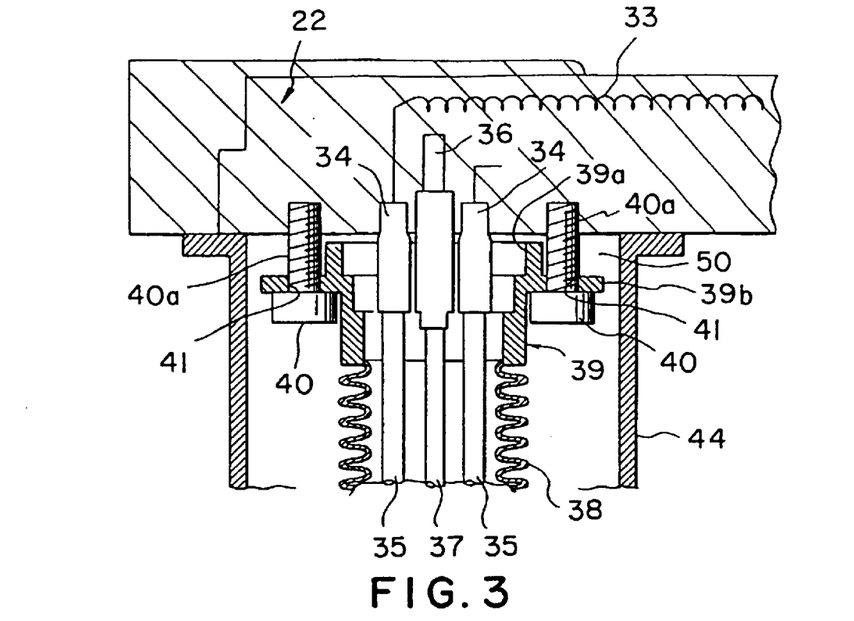
FIG. 3 is an enlarged schematic sectional view of a part of FIG. 2.

A schematic vertical sectional view of the ceramic heater shown in FIG. 1 and the wiring configuration thereof is shown in FIG. 2 and a schematic sectional view of essential components of FIG. 2 is shown in FIG. 3. As shown in these figures, a resistance heating element 33 made of a material such as tungsten (W), molybdenum (Mo), tantalum (Ta), or nickel-chrome (Ni—Cr) is embedded within the ceramic heater 22, and this resistance heating element 33 is connected to terminals 34 made of a metal having a coefficient of thermal expansion similar to that of the main ceramic unit, such as molybdenum. These terminals 34 are connected to power lines 35 that are covered by insulating tubes, and these power lines 35 pass through the base plate 24 and extend to the exterior. A thermocouple 36 for measuring temperatures within the ceramic heater 22 is provided between the terminals 34 and a wire 37 for this thermocouple 36 is disposed between the power lines 35 and similarly extends to the exterior.

The terminals 34, thermocouple 36, power lines 35, and the wire 37 are housed within a metal bellows 38 that acts as a sheath, made of a material such as stainless steel, Hastelloy (tradename), or Inconel (tradename). This sheathing bellows 38 is preferably made from Hastelloy, from the corrosion-resistance viewpoint. The sheathing bellows 38 has a cylindrical end piece 39 made of corrosion-resistant Hastelloy at an upper end thereof. This end piece 39 comprises a cylindrical portion 39a, which extends to close to the surface of the ceramic heater 22, and a seating portion 39b formed of an annular flange that extends outward and to the rear from the cylindrical portion 39a, as shown in FIG. 3. Holes 41 are formed in the seating portion 39b provided at the edge of the end piece 39, for screws (engagement means) 40 to pass therethrough from below to above, only an upper portion of a screw shaft 40a of each of these screws 40 is screwed into the ceramic heater 22, and an annular space 50 is formed between an upper surface of the seating portion 39b of the end piece 39 and a lower surface of the ceramic heater 22. Thus, since only the upper end portions of the screw shafts 40a are screwed into the ceramic heater 22 so that the greater part of each screw shaft 40a is exposed and the annular space 50 is formed between the seating portion 39b and the ceramic heater 22, expansion of the end piece 39 due to the thermal cycle is permitted.

Figure 4:
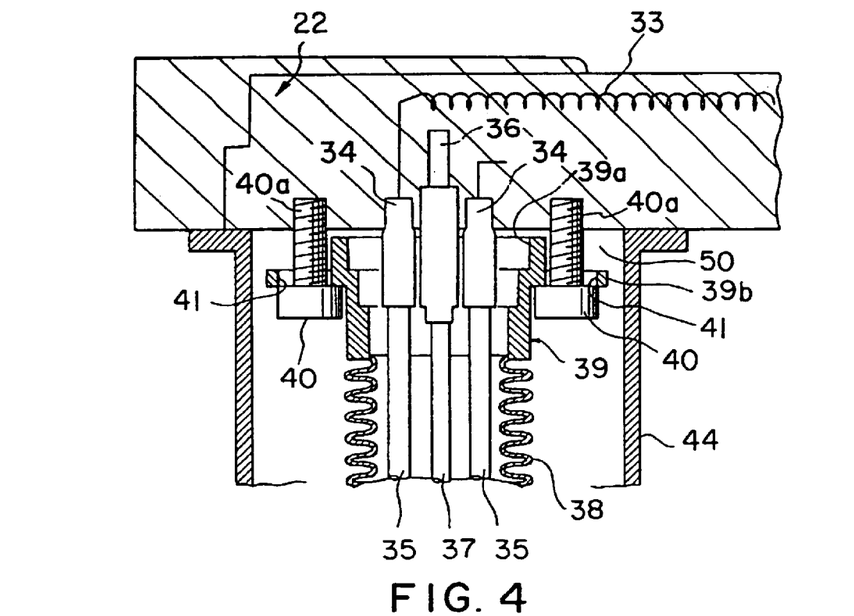
FIG. 4 is an enlarged schematic sectional view of the ceramic heater and wiring configuration of another embodiment of the present invention.

A modified embodiment of the present invention will be described with reference to FIG. 4 which shows an enlargement of the wiring configuration of the ceramic heater. As shown in FIG. 4, the holes 41 of the seating portion 39b of the end piece 39 are formed to have a shape such as elongated or oval, so that they are larger than the diameter of the screw shafts 40a in the radial direction of the end piece 39. This structure can allow even larger thermal expansions of the end piece 39.

As shown in FIG. 2 the sheathing bellows 38 has a flanged pipe member 42 at the lower end thereof that is inserted in the vertical direction into the base plate 24. This pipe member 42 is connected to an inert gas source 51. The configuration of the pipe member 42 is such that an inert gas such as nitrogen is blown thereinto from below and that gas is supplied into the sheathing bellows 38 thereabove to purge it. In addition, blow holes 43 are formed in an upper edge portion of the pipe member 42, to allow the inert gas to blow through the sheathing bellows 38 to the exterior, and thus purge a protective tube 44 (which will be described below) with the inert gas.

The protective tube 44 is provided around the periphery of the sheathing bellows 38 in such a manner as to surround the sheathing bellows 38 with an annular space therebetween, and is made of a corrosion-resistant nonmetallic material such as quartz. Note that this protective tube 44 could equally well be made of another material, such as a ceramic. The upper edge of the protective tube 44 could be connected to the lower surface of the ceramic heater 22 by a screw-thread or the like, or it could be placed, by a spring which will be described hereinafter, in light contact with the ceramic heater 22 in such a manner that the inert gas within the protective tube 44 can flow out into the processing chamber 20. For the purpose of reducing the flow of heat from the ceramic heater 22, it is desirable that the contact between the ceramic heater 22 and the protective tube 44 is made by screw-threads which are tightened through the flange of the protective tube 44 into the ceramic heater 22. The contact between the ceramic heater 22 and the protective tube 44 may be in a partial contact, such as a line contact or a point or spot contact. A ring member 45 is provided fixed to the lower edge of the protective tube 44, a spring 46 is inserted below this ring member 45, and this spring 46 is held at the outer side thereof by a ring member 47 provided in the radially outer side thereof. The protective tube 44 is urged upward by this spring 46. In addition, blow holes 48 are formed in the radial direction of the ring member 45, to allow the inert gas within the protective tube 44 to flow out into the processing chamber 20. Note that reference number 49 denotes a nut for sealing a sealing surface of the ring member 47. A valve 53 for controlling the supply of the inert gas to the interior of the pipe member 42 is provided such that it can move vertically.

The operation of the embodiment of the present invention will now be described. Referring to FIG. 1, the wafer W is introduced into the processing chamber 20 by the conveyor arm (not shown in the figure) through the gate valve G1, it is mounted on the ceramic heater 22 that acts as the susceptor, power is supplied from a power source (not shown in the figure) through the power lines 35 to the resistance heating element 33 to heat the ceramic heater 22, and thus the wafer W is heated to a predetermined temperature. A predetermined quantity of processing gases, such as $TiCl_4$ and $NH_3$, are introduced into the processing chamber 20 from the gas supply portion 21, the interior of the processing chamber 20 is placed in a predetermined degree of vacuum by exhausting the atmosphere therein through the exhaust pipe 28 by the turbo molecular pump 30, and a TiN film is formed on the surface of the wafer.

During the execution of this film-formation process, a gas such as nitrogen is supplied from the inert gas source 51 (FIG. 2) upward into the sheathing bellows 38 from below. This causes the interior of the sheathing bellows 38 to be purged by the inert gas, as shown in FIG. 2, and the inert gas is also blown through the blow holes 43 into the protective tube 44 to purge the interior of the protective tube 44 with the inert gas. The inert gas is also blown into the processing chamber 20 through the blow holes 48.

Cleaning gases such as $ClF_3$ and $NF_3$ are periodically introduced into the processing chamber 20 from the gas supply portion 21, by switching the piping to the gas supply portion 21. A plasma is then formed from these cleaning gases by applying a radio-frequency voltage between the plasma generation electrodes 27 and the walls of the processing chamber 20, so that reaction by-products that have attached to the walls of the processing chamber 20, the ceramic heater 22, or the protective tube 44 can be removed by etching. The supply of nitrogen from the inert gas source 51 into the sheathing bellows 38 continues during this cleaning. It should be noted, however, that the inert gas could be another gas such as argon or helium, provided it does not impede the formation of plasma by the cleaning gases.

In this manner, this embodiment of the invention makes it possible to prevent corrosion of the sheathing bellows 38 by highly corrosive cleaning gases such as $ClF_3$ and $NF_3$ during the cleaning, by providing the protective tube 44 between the ceramic heater 22 and the walls of the processing chamber 20, thus protecting the sheathing bellows 38. In addition, the interior of the sheathing bellows 38 is purged by the inert gas, as described above, the inert gas is blown out through the blow holes 43 into the protective tube 44 to purge the interior of the protective tube 44 with the inert gas, and also the inert gas is blown into the processing chamber 20 through the blow holes 48. This makes it possible to prevent the backward flow of highly-corrosive gases into the sheathing bellows 38, the periphery of the sheathing bellows 38 is also placed in an inert gas atmosphere so that the corrosion thereof can be prevented, and the generation of particles can be suppressed.

Since only the upper portions of the screw shafts 40a of the screws 40 are engaged with the ceramic heater 22, the larger portions of the screw shafts 40a are exposed, and the annular space 50 is formed between the seating portion 39b and the ceramic heater 22, thermal expansion of the end piece 39 due to the thermal cycles is permitted. The end piece 39 is fixed to the ceramic heater 22 by substantially the screws alone, making it more difficult for heat to escape to the end piece 39 and the sheathing bellows 38 from the ceramic heater 22 that has been heated to a predetermined temperature by the resistance heating element 33, than the prior-art connection provided by gold-soldering, making it possible to improve the uniformity of the temperature distribution over the surface of the ceramic heater 22 and thus improve the uniformity of the film formed on the wafer W.

Since the screws 40 make it possible to permit thermal expansion of the end piece 39 due to the thermal cycles, the connective portion between the end piece 39 and the ceramic heater 22 is not damaged and there is no leakage and dispersion of the cleaning gases such as $ClF_3$ and $NF_3$ into the end piece 39 during the cleaning, in comparison with the prior-art connection provided by gold-soldering. This prevents the corrosion of components such as the terminals 34 and the power lines 35, making it possible to suppress the generation of particles.

Figure 5:
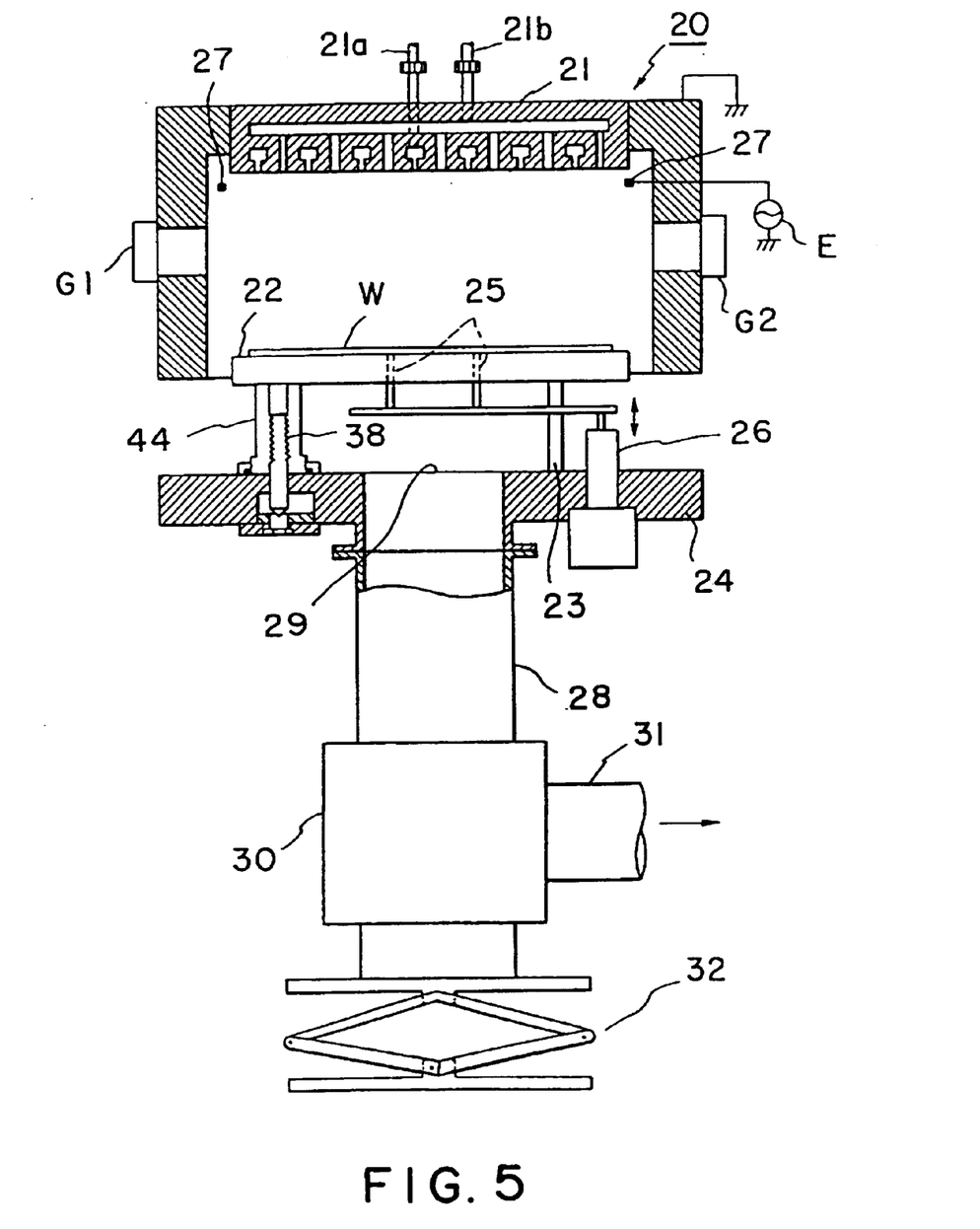
FIG. 5 is a schematic sectional view of the CVD film-formation apparatus in a state in which the base plate portion of the processing chamber has been lowered.

Maintenance of this CVD film-formation apparatus can be performed, as shown in FIG. 5, by removing screws (not shown in the figure) between the base plate 24 and the side walls of the processing chamber 20, lowering the base plate 24 by the jack mechanism 32 together with the exhaust pipe 28 and the turbo molecular pump 30, then pulling out from below the internal components attached to the base plate 24, such as the ceramic heater 22, the elevator mechanism 26 for the pusher pins 25, the plasma generation electrodes 27 for cleaning, and the wiring of the ceramic heater. This makes maintenance far easier than in a configuration in which the processing chamber 20 is dismantled.

Figure 7:
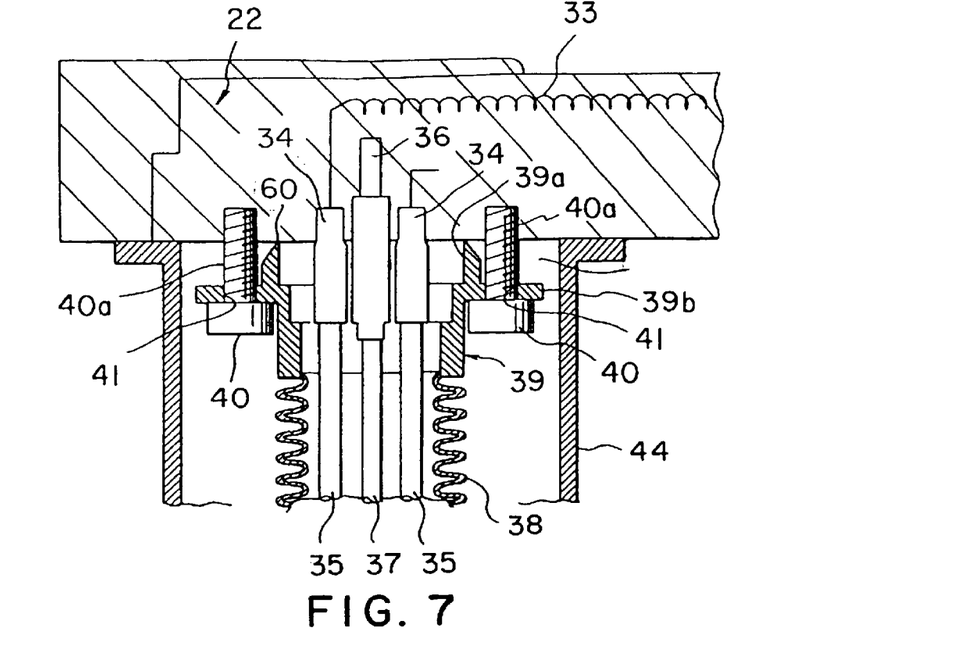
FIG. 7 is a view similar to FIG. 3 but showing another embodiment of the invention.
Figure 8:
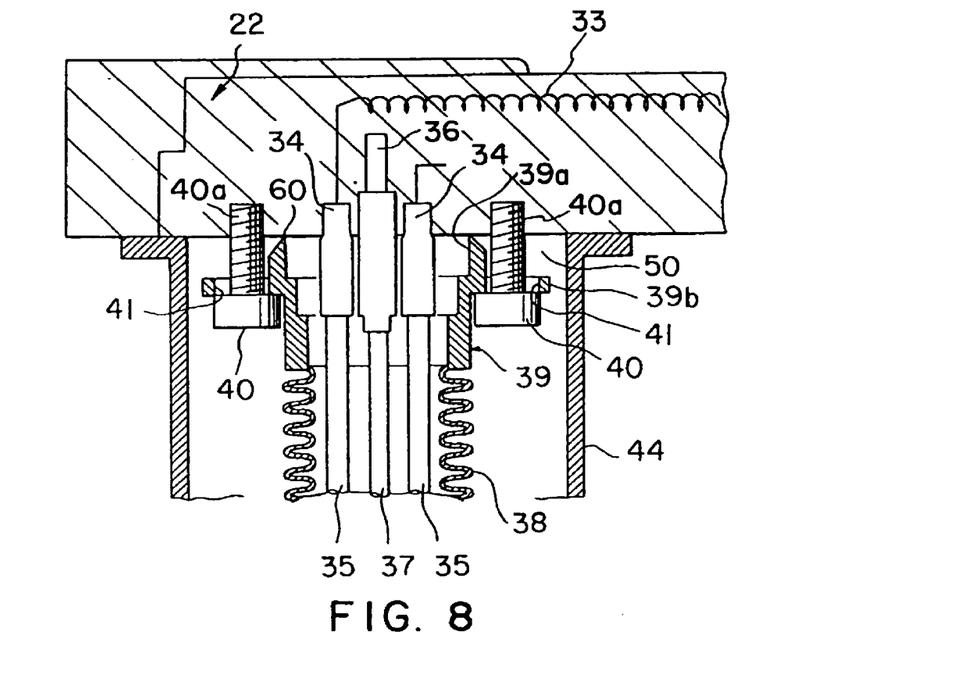
FIG. 8 is a view similar to FIG. 4 but showing a further embodiment of the invention.

FIGS. 7 and 8 show embodiments of the invention using a modified annular end piece 39. FIG. 7 is a view similar to FIG. 3, showing a part of the ceramic heater and wiring configuration, in which the modified end piece 39 is used. As shown, the modified end piece 39 is basically of the same configuration as the end piece shown in FIG. 3, but is different from the latter in that the cylindrical portion 39a is formed with a sharp annular edge 60 adjacent to the lower surface of the ceramic heater 22. This sharp annular edge 60 is in contact with the lower surface of the ceramic heater 22 when assembled in position as shown in FIG. 7. More specifically, when the screw shafts 40 are tightened as shown in FIG. 7, the sharp annular edge 60 is caused to abut on the lower surface of the ceramic heater 22 in annular line contact therewith with the annular space 50 left between the seating portion 39b and the lower surface of the ceramic heater 22. This line contact is advantageous in suppressing heat transmission from the ceramic heater 22 to the end piece 39 to a minimum while the end piece 39 is securely held to the ceramic heater 22 by means of the screw shafts 40. For this reason, heat is prevented from being transmitted out of the ceramic heater 22 so that the temperature distribution in the ceramic heater 22 is maintained uniform. Therefore, the temperature distribution in the object to be processed is maintained constant so that the uniformity of a film formed thereon is improved.

The modified end piece 39 shown in FIG. 8 may be used also in the device in which the circular holes 41 are formed to have a shape such as elongated or oval, as in the case of FIG. 4.

Figure 9:
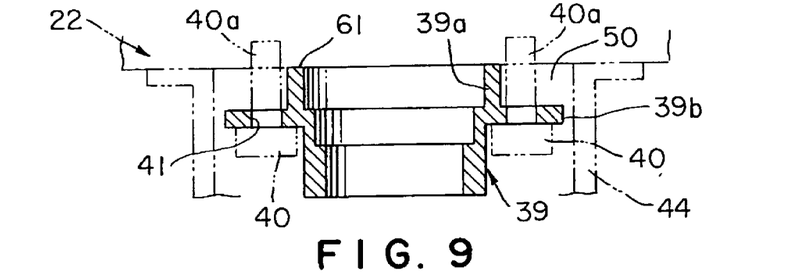
FIG. 9 is a sectional view of a modified end piece.

FIG. 9 shows a modification of the annular end piece 39 shown in FIGS. 7 and 8. The annular end piece 39 shown in FIGS. 7 and 8 has a sharp annular edge 60. This sharp annular edge 60 may be substituted by a blunt annular edge 61 as shown in FIG. 9. The blunt annular edge 61 may have an annular planar end surface that is to be brought into contact with the lower surface of the ceramic heater 22. The blunt annular edge 61 shown has the same thickness as the cylindrical portion 39a. The thickness of the blunt annular edge 61 should not be too thick since otherwise heat transmission from the ceramic heater 22 to the cylindrical portion 39a would be high.

Figure 10:
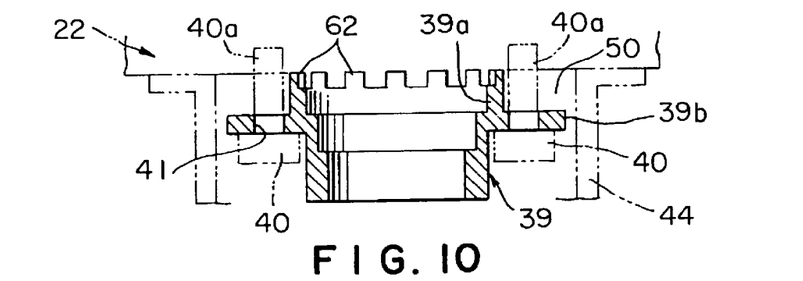
FIG. 10 is a sectional view of a further modified end piece.

FIG. 10 shows another modified form of the end piece 39. This modified end piece 39 is formed with protrusions 62 projecting toward the lower surface of the ceramic heater 22. These protrusions 62 are formed integrally with the cylindrical portion 39a of the end piece 39 at uniform circumferential distances. The top of each of the protrusions 62 may be formed flat or planar so that when the screw shafts 40 are tightened, the planar top of each protrusion 62 is brought into face-to-face spot contact with the lower surface of the ceramic heater 22. This spot contact of the end piece 39 is advantageous in suppressing heat transmission from the ceramic heater 22 to the end piece 39 to a minimum. It will be understood that also in this modified form the same advantage as the end piece shown in FIG. 9 is obtained. The top of each protrusion 62 may be formed in other shapes such as a dome-shape. It will be understood that the domeshaped configuration of the tops of the end pieces more effectively suppresses that transmission from the ceramic heater 22 to the end piece 39.

Figure 11:
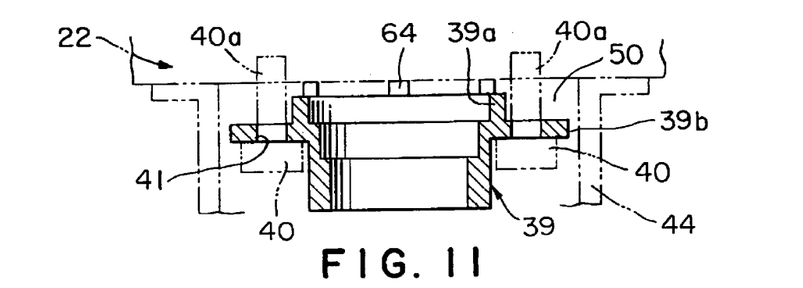
FIG. 11 is a sectional view of a still further modified end piece.
Figure 12:
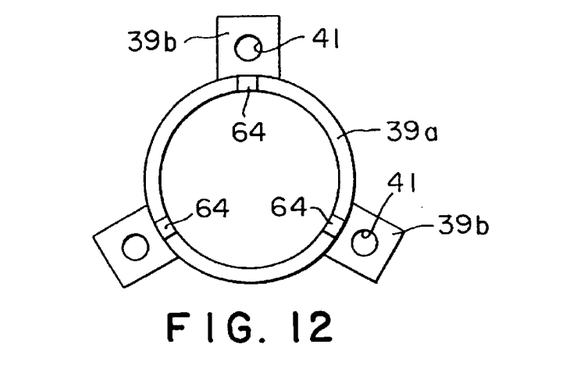
FIG. 12 is a plan view of the end piece shown in FIG. 11.

FIGS. 11 and 12 show a further modified end piece 39 in which protrusions 64 are formed separately from the end piece 39 and fixedly attached to the upper end of the cylindrical portion 39a of the end piece 39. For example, three protrusions 64 may be provided at an angle of 120 degrees as shown in FIG. 12. The advantage of this end piece 39 is substantially the same as the end piece shown in FIG. 10.

The present invention is not limited to the embodiments described above; it can be applied to a wide variety of other applications such as the fabrication of glass LCD substrates. For example, the object to be processed is not limited to a semiconductor wafer, it could also be a glass LCD substrate. In addition, the gas processing apparatus is not limited to a plasma CVD film-formation apparatus; it could equally well be a thermal CVD film-formation apparatus. Similarly, the present invention is not limited to a film-formation apparatus; it could equally well be applied to an etching apparatus.

EXAMPLE

Measurements were made of the temperature distribution within the surface of a ceramic heater to which the present invention was applied. For comparison, measurements were also made of the temperature distribution within the surface of a ceramic heater of the prior-art configuration with gold-soldering, as shown in FIG. 13.

Figure 6A:
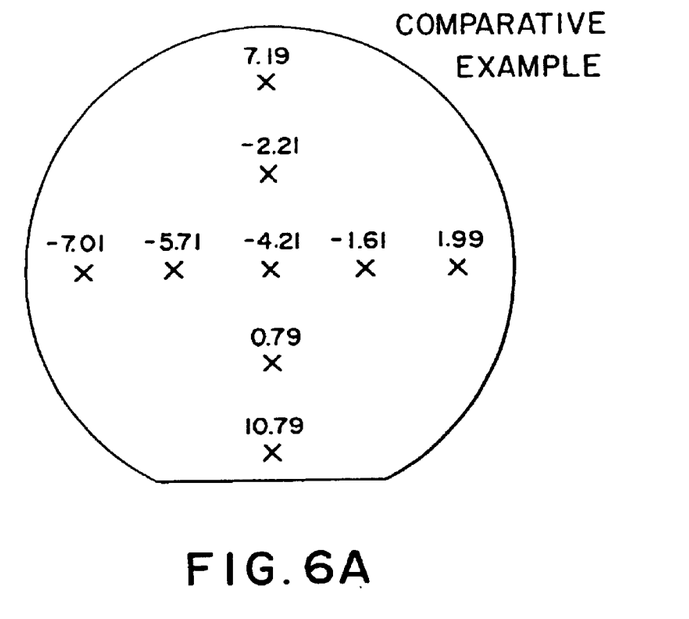
FIGS. 6A and 6B show the results of measuring in-surface temperature distributions relating to a comparative example and this embodiment of the invention respectively.
Figure 6B:
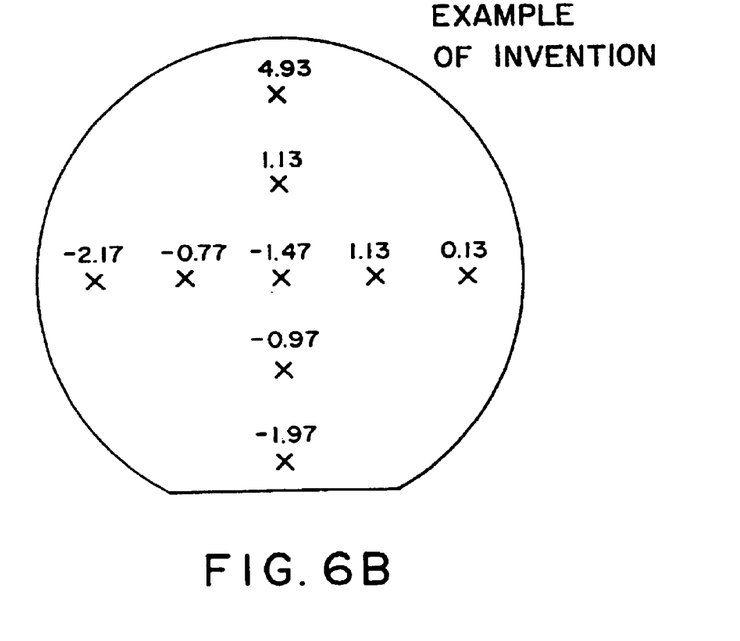

During the measurement of in-surface temperature distributions, both the embodiment of this invention and the comparative example had a set heater temperature of 600° C. and a pressure within the processing chamber of 150 mTorr. The results of these measurements are shown in FIG. 6A for the comparative example and FIG. 6B for the example of this invention. The values shown in FIGS. 6A and 6B illustrate the differences between "uniform temperatures at nine measurement points" and "the temperature at each measurement point." The results show that the in-surface temperature distribution of this embodiment of the present invention is suppressed to +/−0.63%, in contrast to the comparative example of FIG. 6A where the in-surface temperature distribution ranges over +/−1.52%. Note that signs are affixed to the calculated values of (maximum in-surface temperature minimum in-surface temperature)× 100/(2×in-surface temperature distribution) for the in-surface temperature distribution.

In this manner, the present invention makes it possible to design a uniform surface temperature distribution for the ceramic heater 22, thus making it possible to improve the uniformity of the film formed on the wafer W.

As described above, since an engagement means is used to connect the metal tube to the susceptor, the present invention makes it more difficult for heat to escape to the metal tube from the susceptor that has been heated to a predetermined temperature by the resistance heater, than the prior-art connection provided by gold-soldering, making it possible to improve the uniformity of the temperature distribution over the surface of the susceptor and thus improve the uniformity of the processing.

What is claimed is:

1. A gas processing apparatus for an object to be processed, comprising:
   a processing chamber;
   a susceptor, provided within said processing chamber, for supporting an object to be processed;
   means for supplying a processing gas into said processing chamber to perform a predetermined process on said object;
   a resistance heater embedded in said susceptor for heating said object;
   a power line with one end thereof being led out from a surface of said susceptor that is connected to said resistance heater and the another being extended to exterior of said processing chamber;
   a metal sheath interposed between said surface of said susceptor and a wall of said processing chamber, for surrounding said power line so as to house said power line in an insulated state, said sheath having an annular end piece provided at an end portion thereof adjacent to said surface of said susceptor; and
   means for connecting said annular end piece with said surface of said susceptor in such a manner that said end piece is not in contact with said surface of said susceptor and a space is formed between said end piece and said surface of said susceptor.

2. The gas processing apparatus for an object to be processed as defined in claim 1, wherein:
   said means for connecting said annular end piece with said surface of said susceptor includes a screw shaft passed through said end piece and screwed partially into said surface of said susceptor.

3. The gas processing apparatus for an object to be processed as defined in claim 1, wherein:
   said annular end piece includes a cylindrical portion extending toward said surface of said susceptor and a seating portion in the form of a flange extending outward from said cylindrical portion, said flange having a hole through which said screw shaft is passed.

4. The gas processing apparatus for an object to be processed as defined in claim 3, wherein:
   said hole has dimensions such that said screw shaft passes loosely therethrough.

5. The gas processing apparatus for an object to be processed as defined in claim 1, wherein:
   at least a portion of said sheath includes a bellows.

6. The gas processing apparatus for an object to be processed as defined in claim 1, further comprising:
   a corrosion-resistant tube made of a non-metallic material interposed between said surface of said susceptor and said wall of said processing chamber, and surrounding said sheath with a space therebetween.

7. The gas processing apparatus for an object to be processed as defined in claim 1, further comprising:
   an inert gas supply means for supplying an inert gas into said sheath.

8. The gas processing apparatus for an object to be processed as defined in claim 7, wherein:
   said inert gas supply means incudes a gas supply pipeline that passes through said wall of said processing chamber.

9. The gas processing apparatus for an object to be processed as defined in claim 1, further having:
   a corrosion-resistant tube made of a nonmetallic material interposed between said surface of said susceptor and said wall of said processing chamber, and surrounding said sheath with a space therebetween;
   an inert gas supply means for supplying an inert gas into said sheath;
   a blow hole provided in said sheath in such a manner that an inert gas supplied into said sheath is permitted to flow through said space between said sheath and said corrosion-resistant tube; and
   a blow hole provided in said corrosion-resistant tube in such a manner that said inert gas in said space is permitted to flow out into said processing chamber.

10. The gas processing apparatus for an object to be processed as defined in claim 1, wherein:

said processing chamber includes an upper casing and a base plate portion attached in a freely removable manner to a lower edge portion of said upper casing, said susceptor is mounted by support means on an inner side of said base plate portion, and said base plate is capable of being raised and lowered by an elevator means.

* * * * *